United States Patent
Maslennikov et al.

(10) Patent No.: US 9,083,284 B2
(45) Date of Patent: Jul. 14, 2015

(54) WIDE-BAND MULTI STAGE DOHERTY POWER AMPLIFIER

(75) Inventors: Nikolai Maslennikov, Huntington Beach, CA (US); Ahmad Khanifar, Laguna Hills, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/413,468

(22) Filed: Mar. 6, 2012

(65) Prior Publication Data

US 2012/0231753 A1 Sep. 13, 2012

Related U.S. Application Data

(60) Provisional application No. 61/450,093, filed on Mar. 7, 2011.

(51) Int. Cl.
*H01Q 11/12* (2006.01)
*H03F 1/02* (2006.01)
*H03F 1/42* (2006.01)

(52) U.S. Cl.
CPC ............... *H03F 1/0288* (2013.01); *H03F 1/42* (2013.01); *H03F 2200/192* (2013.01); *H03F 2200/408* (2013.01)

(58) Field of Classification Search
USPC ............ 330/124 R, 286, 295, 10; 455/241.1, 455/127.1
See application file for complete search history.

(56) References Cited

U.S. PATENT DOCUMENTS

| | | | |
|---|---|---|---|
| 6,085,074 A * | 7/2000 | Cygan ........................ 455/241.1 |
| 6,794,933 B2 | 9/2004 | Gurvich et al. |
| 7,288,987 B2 | 10/2007 | Carichner et al. |
| 7,362,170 B2 | 4/2008 | Louis |
| 2004/0113698 A1* | 6/2004 | Kim et al. ..................... 330/295 |

* cited by examiner

*Primary Examiner* — Junpeng Chen
(74) *Attorney, Agent, or Firm* — Schwegman Lundberg & Woessner, P.A.

(57) ABSTRACT

A multi-stage Doherty power amplifier ("PA") circuit which achieves superior efficiency over broadband range of frequencies is disclosed. Conventional multi-stage amplifiers may offer potential for efficiency enhancement but may suffer from cost penalties and severe bandwidth limitation in practice. Embodiments may employ a driver in the peaking arm which is biased in class C which may alleviate such limitations. The amplifier topology and associated circuitry described in embodiments may achieve high efficiency, smooth PA gain, and enhanced phase characteristics over a 15% fractional bandwidth with reduced costs.

12 Claims, 3 Drawing Sheets

WIDE-BAND MULTI STAGE DOHERTY POWER AMPLIFIER

RELATED APPLICATION INFORMATION

The present application claims priority under 35 U.S.C. Section 119(e) to U.S. Provisional Patent Application Ser. No. 61/450,093 filed Mar. 7, 2011, the disclosure of which is incorporated herein by reference in its entirety.

BACKGROUND OF THE INVENTION

1. Field of the Invention

This present invention is related in general to high efficiency power amplifier systems and methods. More particularly, the invention is directed to systems and methods for power amplifiers exhibiting wide instantaneous signal bandwidth.

2. Description of the Prior Art and Related Background Information

The surge in wireless data traffic has continued over the past two decades and there is no evidence of a change in this trend. Given the propagation properties of the electromagnetic energy, for optimum coverage, carrier frequencies at lower frequency bands (i.e. from a fraction of a Giga Hertz to a few Giga Hertz) are preferred. However, the commercial competition for access to bandwidth resources is also fierce which limits the available bandwidth for each service. The limited available bandwidth allocated to cellular communication has resulted in a gradual but steady "systems bandwidth efficiency" improvement. By implication, more sophisticated modulation schemes may be devised to improve the system throughput and its figure of merit such as bit/Hertz/s. The byproduct of these developments are that, throughout the system air interface, from transmitter to receiver end, the carrier signals have to preserve precise amplitude and phase modulation, and therefore, less distortion is tolerated. At the same time, both amplitude and phase (frequency) of the carrier now bear information which leads to a modulated carrier with relatively high amplitude variation. Hence, most digitally modulated carrier signals used in modern telecommunication systems have an amplitude envelope showing a large peak to average ratio. In such systems, to preserve modulation accuracy and prevent transmitter spurious emissions, the amplifying device has to maintain high linearity by having sufficient headroom for the signal peaks, albeit producing a modest average output power and therefore leading to low DC to RF conversion efficiency.

Even from the early days of AM broadcasting and in more recent complex transmission systems such as satellite communications, cable TV, and more recently cellular telephony, the carrier amplifiers have been mostly used in conjunction with some means of linearization to achieve the required performance. Feedback, and in RF frequency bands, feedforward systems have been widely used. Analog predistortion has been also used since the early days of satellite communication where frequency division multiple access ("FDMA") systems were employed for sharing transponder bandwidth. In recent years, with the advent of digital signal processing ("DSP"), digital predistortion has become the preferred choice.

Nonetheless, despite the significant advances in linearization of RF power amplifiers, such techniques typically come at the expense of amplifier sub-system efficiency. Therefore, it is desirable to have additional improvement to achieve linearity and improve efficiency in RF amplifier subsystems.

It is well known that amplifiers exhibit high efficiency when they are operated at their maximum output capability and are actually driven into saturation. The Doherty amplifier is one of the popular techniques for efficiency enhancement and is based on the above principle for efficiency enhancements. In a classic Doherty pair comprising of a main amplifier 10 and peaking amplifier 12 shown in FIG. 1, the main amplifier 10 is biased at class-AB and reaches its saturation state some 6 dB below the total rated output power of the pair and, therefore, shows high efficiency at back off. As signal envelope increases, the peaking amplifier 12 biased at class-C turns on and pulls the main amplifier load down while increasing the main amplifier load increases gradually. This mode of operation widely known as load-modulation allows the main amplifier's load to decrease at higher power levels, and in effect, has a linearizing consequence. Hence the Doherty amplifier efficiency enhancement results by extending the saturation region to a much wider range of output power while maintaining a reasonable degree of linearity.

The Doherty pair is normally used as the final stage in an amplifier chain and is preceded by several lower power linear driver amplifier stages. The basic amplifier architecture referenced in prior art is shown in FIG. 2. In this basic architecture, the output of driver stage 14 is divided in two halves by signal splitter 16 which drives the main amplifier 10 and peaking amplifier 12 and hence must be sized sufficiently to generate the required drive level. Given the fact that at back off region of input signal excursion, the energy delivered to the peaking amplifier 12 is not actually used, and the driver is a linear stage, it seems an area for enhancing Doherty power amplifier ("PA") efficiency may be to move the driver stage 14 after the signal splitter 16. By doing so, two smaller driver stages can be used and the driver for the peaking amplifier 12 can be also a class-C stage in embodiments disclosed herein and hence saving driver energy waste. FIG. 3 illustrates a modified Doherty configuration which is based on U.S. Pat. No. 7,362,170 B2 to Louis. However, the approach outlined in the above referenced patent does not result to an optimum solution in two respects: cost and also performance over wide bandwidth. The embodiments described in the following section may disclose a new approach leading to a cost effective and ultra broad band performance.

Accordingly, a need exists to improve the performance of power amplifiers.

SUMMARY OF THE INVENTION

In a first aspect the present invention provides a power amplifier adapted for amplifying an RF signal comprising an input for receiving an RF input signal, and a divider circuit coupled to the input and receiving the input signal and splitting the input signal into a first input signal and a second input signal. The power amplifier further comprises a main signal path coupled to the divider circuit and receiving the first input signal and providing an amplified main signal, the main signal path comprising a main path driver amplifier and a main amplifier. The main signal path further comprises a passive attenuator receiving the first input signal and providing an attenuated first input signal to the input of the main path driver amplifier. The power amplifier further comprises a peaking signal path coupled to the divider circuit and receiving the second input signal and providing an amplified peaking signal, the peaking signal path comprising a peaking path driver amplifier and a peaking amplifier. The peaking path driver amplifier has substantially the same power rating as the main path driver amplifier and is biased in a higher efficiency class than the main path driver amplifier.

In a preferred embodiment the main path driver amplifier output is coupled to the input of the main amplifier. The main path driver amplifier is preferably biased in class AB. The divider circuit preferably comprises a 3 dB coupler. The power amplifier adapted for amplifying an RF signal preferably comprises a quarter wave combiner circuit receiving the amplified main signal and the amplified peaking signal and providing an output signal. The peaking amplifier is preferably biased in class C.

In another aspect, a power amplifier adapted for amplifying an RF signal, comprises an input for receiving an RF input signal, a divider circuit receiving the input signal and splitting the input signal into a first input signal and a second input signal, and a main signal path coupled to the divider circuit and receiving the first input signal and providing an amplified main signal, the main signal path comprising a first main signal path isolator and a main amplifier. The power amplifier further comprises a peaking signal path coupled to the divider circuit and receiving the second input signal and providing an amplified peaking signal, the peaking signal path comprising a first peaking signal path isolator and a peaking amplifier.

In a preferred embodiment, the main signal path further comprises a main path driver amplifier having an output coupled to the input to the main amplifier and an input coupled to the output of the first main signal path isolator, and the peaking signal path further comprises a peaking path driver amplifier having an output coupled to the input of the peaking amplifier and an input coupled to the output of the first peaking signal path isolator. The main path driver amplifier preferably has a power rating approximately equal to a power rating of the peaking path driver amplifier. The divider circuit preferably comprises a 3 dB coupler. The main signal path preferably further comprises a passive attenuator coupled to the output of the first main signal path isolator and the input of the main path driver amplifier. The power amplifier adapted for amplifying an RF signal preferably further comprises a quarter wave combiner circuit receiving the amplified main signal and the amplified peaking signal and providing an output signal. The peaking amplifier is preferably biased in class C. The main signal path preferably further comprises a second main signal path isolator coupled between the output of the main path driver amplifier and the input of the main amplifier, and the peaking signal path further comprises a second peaking signal path isolator coupled between the output of the peaking path driver amplifier and the input of the peaking amplifier.

In another aspect the present invention provides a method for amplifying an RF input signal, the method comprising receiving an RF input signal, splitting the input signal into first and second substantially equal power input signals between a main signal path and a peaking signal path, the main signal path receiving the first input signal and the peaking signal path receiving the second input signal, attenuating the first input signal to provide an attenuated first input signal, amplifying the attenuated first input signal in the main signal path with a main path driver amplifier to provide a first-stage amplified main signal, and amplifying the first-stage amplified main signal in the main signal path with a main amplifier to provide an amplified main signal. The method further comprises amplifying the second input signal in the peaking signal path with a peaking path driver amplifier biased in class C to provide a first-stage amplified peaking signal, amplifying the first-stage amplified peaking signal with a peaking amplifier to provide an amplified peaking signal, and combining the amplified main signal and the amplified peaking signal and providing an output signal.

In a preferred embodiment, the main path driver amplifier has a power rating approximately equal to a power rating of the peaking path driver amplifier.

In another aspect the present invention provides a method for amplifying an RF input signal, comprising receiving an RF input signal, splitting the input signal into first and second substantially equal power input signals between a main signal path and a peaking signal path, the main signal path receiving the first input signal and the peaking signal path receiving the second input signal, removing reflected power in the main signal path with a first main isolator to provide an isolated first input signal, amplifying the isolated first input signal in the main signal path with a main path driver amplifier to provide a first-stage amplified main signal, and amplifying the first-stage amplified main signal in the main signal path with a main amplifier to provide an amplified main signal. The method further comprises removing reflected power in the peaking signal path with a first peaking isolator to provide an isolated second input signal, amplifying the isolated second input signal in the peaking signal path with a peaking path driver amplifier biased in class C to provide a first-stage amplified peaking signal, amplifying the first-stage amplified peaking signal with a peaking amplifier to provide an amplified peaking signal, and combining the amplified main signal and the amplified peaking signal and providing an output signal.

In a preferred embodiment, amplifying the isolated first input signal comprises attenuating the isolated first input signal with a passive attenuator to provide an attenuated first input signal, and amplifying the attenuated first input signal to provide the first-stage amplified main signal.

Amplifying the first-stage amplified main signal preferably further comprises removing reflected power in the main signal path with a second main isolator to provide an isolated first-stage amplified main signal, and amplifying the isolated first-stage amplified main signal to provide the amplified main signal. Amplifying the first-stage amplified peaking signal preferably further comprises removing reflected power in the peaking signal path with a second peaking isolator to provide an isolated first-stage amplified peaking signal, and amplifying the isolated second-stage amplified peaking signal to provide the amplified peaking signal. The main path driver amplifier preferably has a power rating approximately equal to a power rating of the peaking path driver amplifier.

Further features and aspects of the invention are set out in the following detailed description.

DETAILED DESCRIPTION OF THE INVENTION

Embodiments of a power amplifier circuit configuration may achieve superior efficiency over broadband range frequencies using a multi-stage Doherty configuration. Conventional multi-stage Doherty amplifier configurations may offer potential for efficiency enhancement. However these configurations may suffer severe bandwidth limitation in practice and may have higher costs. Embodiments disclosed herein may alleviate such limitations. Embodiments of the amplifier topology and associated circuitry may achieve higher efficiency and smooth PA gain and phase characteristics over a 15% fractional bandwidth.

Teachings related to systems and methods employing power amplifiers disclosed in U.S. Pat. No. 7,362,170 to Louis dated Apr. 22, 2008 may be employed herein and the disclosure of which is incorporated herein by reference in its entirety. Distinctions between bias classes and the definitions of classes such as, but not limited to, class A, class B, class C, class AB, class BC are generally understood in the art for a wide variety of devices. Teachings related to bias classes disclosed in U.S. Pat. No. 6,794,933 to Gurvich dated Sep. 21, 2004 and U.S. Pat. No. 7,288,987 to Carichner dated Oct. 30, 2007 may be employed herein and the discloses of which are incorporated herein by reference in their entireties.

Figure 1:
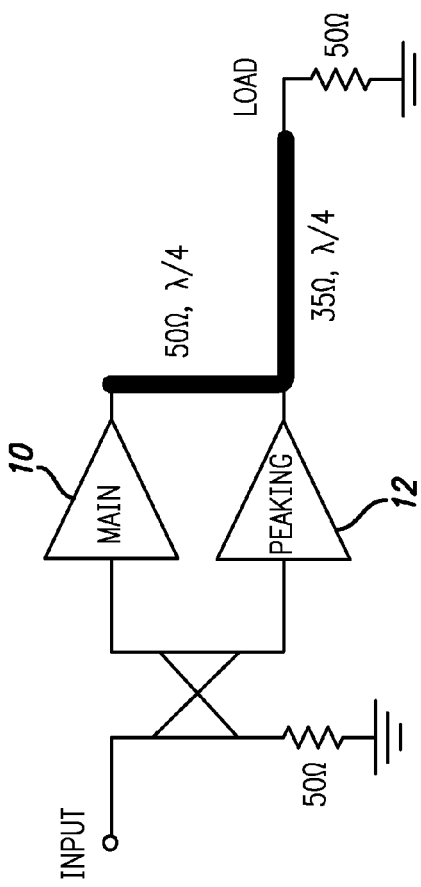
FIG. 1 is a schematic block diagram of a classic Doherty power amplifier configuration.
Figure 2:
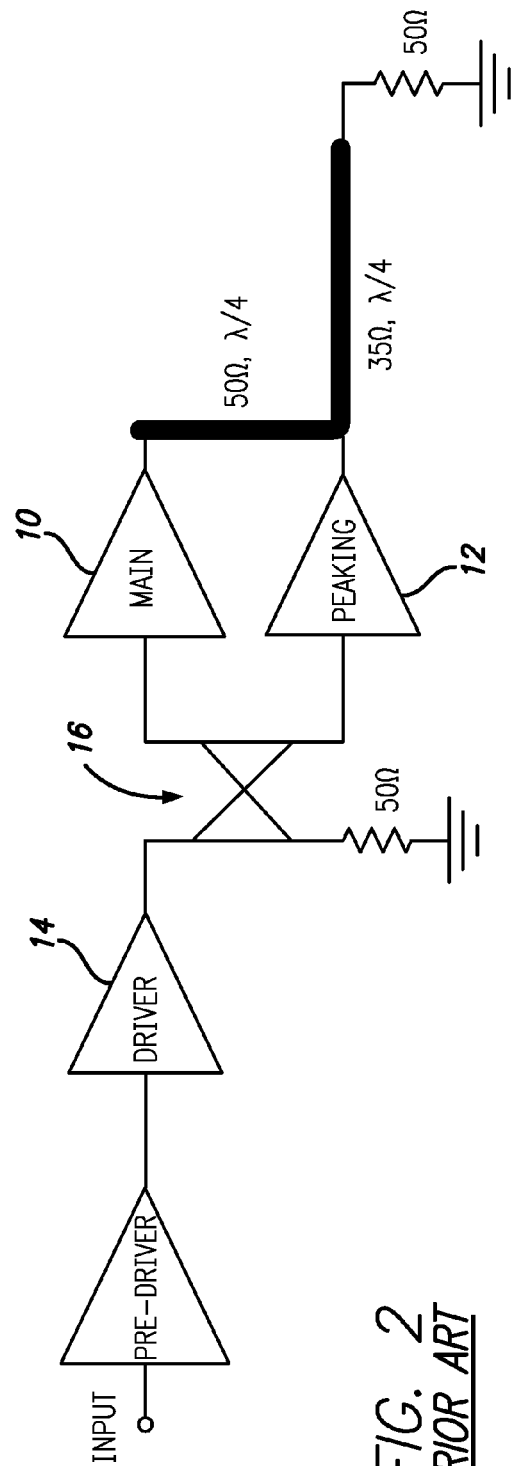
FIG. 2 is a schematic block diagram of a Doherty power amplifier forming the last stage of a multi-stage power amplifier.

As discussed above, a multi-stage power amplifier shown in FIG. 2 is a classic implementation using a single stage Doherty amplifier. One approach outlined in U.S. Pat. No. 7,362,170 ("Louis") suggests a configuration using a multi-stage Doherty amplifier as reproduced in FIG. 3 by reference to FIG. 3 of Louis. It is evident from this drawing that the power rating of driver stage 80 (i.e., 40 Watts) used in peaking amplifier arm 74 is twice the power rating of the main amplifier driver 76 (i.e., 20 Watts). The preceding coupler 84 has been altered from 3 dB in the case of a conventional Doherty to 5 dB division ratio to allow for a larger drive level needed for the larger amplifier 80. It was also suggested that the peaking amplifier driver 80 should be biased at class B or possibly slightly into the NB or B/C regions to achieve the required linearity.

Figures 3, 4:
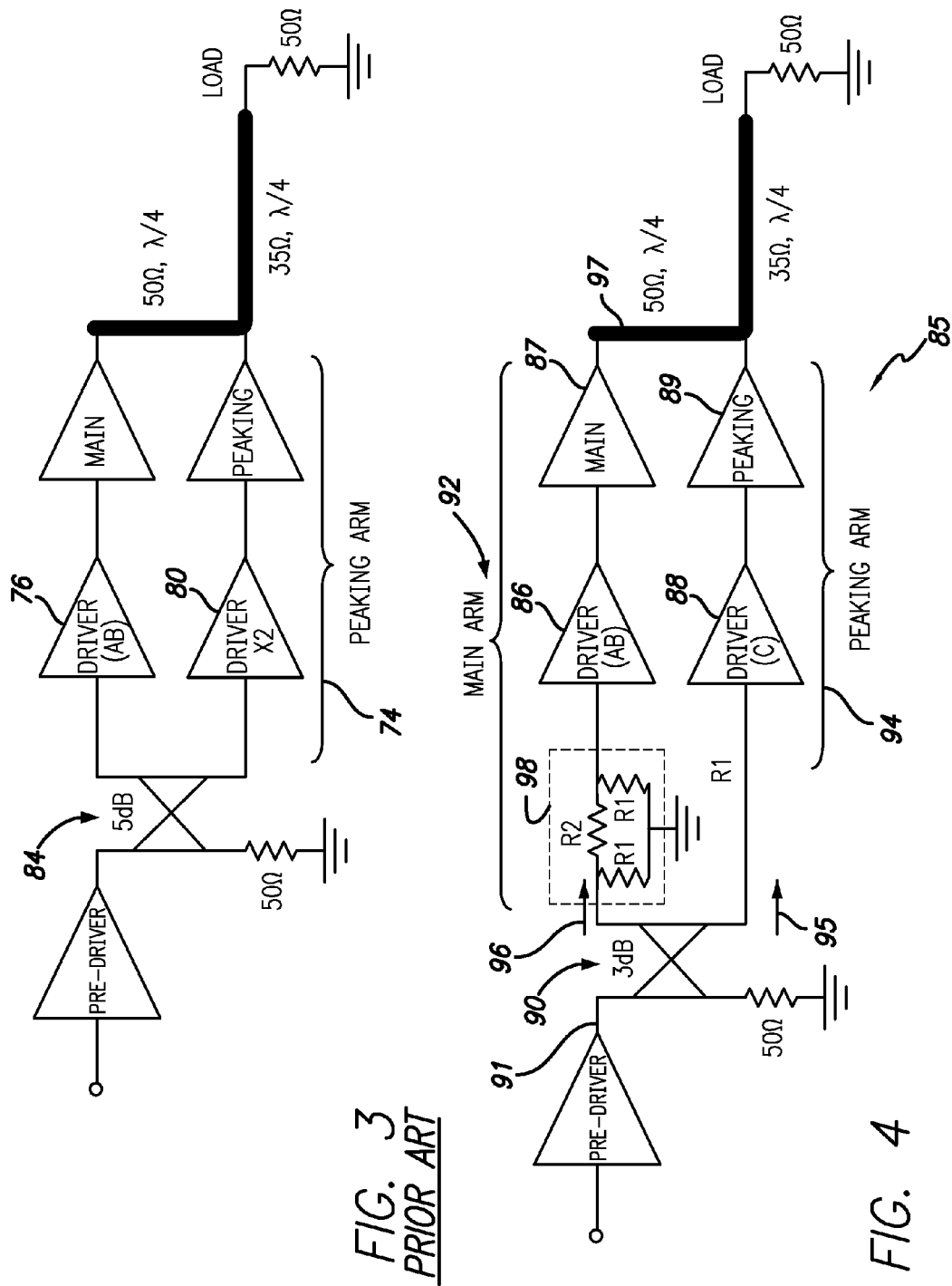
FIG. 3 is a schematic block diagram of a multi-stage Doherty amplifier discussed in the prior art.
FIG. 4 is a schematic block diagram illustrating an embodiment of a Multi-stage Doherty power amplifier.

Embodiments may exhibit reduced costs of the amplifier chain by reducing the power rating of peaking amplifier driver 80 to be the same as power rating of the driver for the main amplifier 76. FIG. 4 depicts this arrangement, where the divider circuit 90 is now only a 3 dB coupler.

FIG. 4 illustrates an exemplary embodiment of a power amplifier 85 having an input 91, a divider circuit 90 coupled to the input 91, a main arm 92, a peaking arm 94, and a combiner circuit 97. The divider circuit 90 splits the signal from input 91 and provides a first input signal 96 to the main arm 92 and a second input signal 95 to the peaking arm 94. The main arm 92 may comprise a passive attenuator 98 which receives the first input signal 96 and has an output coupled to the input of a main driver 86. The output of the main driver 86 may be coupled to the input of main amplifier 87, which provides an amplified main signal at the output of the main amplifier 87. The peaking arm 94 may comprise a peaking driver 88 which receives the second input signal 95 and may have an output coupled to the input of a peaking amplifier 89 which provides an amplified peaking signal at the output of the peaking amplifier 89. A combiner circuit 97 may receive the amplified main signal and the amplified peaking signal and provides an output signal to the load.

The bias point for the peaking amplifier driver 88 may be also chosen to be at class-C. By implication there will be a gain imbalance between the main amplifier arm 92 and the peaking amplifier arm 94. Embodiments employing a divider circuit 90 comprising a 3 dB coupler the gain imbalance may employ a passive attenuator 98 inserted before the main amplifier driver 86. The above arrangement may reduce the size of peaking amplifier driver 88 which may lead to cost savings. It may be possible to use unequal power division but, in that case, the bias point of peaking amplifier driver 88 depicted in FIG. 4 may have to be adjusted accordingly to account for a higher drive level.

One or more embodiments specifically relates to bandwidth of the amplifier. It is well-known to one skilled in the art that the design of any stages of PA involves the design of matching circuit design. The resulting match that is achievable depends on the load values (resistive and reactive parts) and the desirable bandwidth. The Bode-Fano integral sets the upper bound for the achievable bandwidth vs. input reflection coefficient of the matching network:

$$\int_0^\infty \mathrm{Ln}\left|\frac{1}{\Gamma(\omega)}\right| \cdot d\omega \le \frac{\pi}{RC} \quad (1)$$

Or $$\mathrm{Ln}\frac{1}{|\Gamma_{min}|} = \frac{\pi}{RC(\omega_2 - \omega_1)} \quad (2)$$

It is evident from the above equations that, for a typical power transistor such as a 100 Watt LDMOS device having an output resistive impedance of ~1-1.2Ω and $C_{ds}$ of 200 pF, the reflection coefficient would deteriorate as the required bandwidth increases.

The RF bandwidth of a PA and the flatness of a PA have a direct impact on its linearizability. The PA flatness should extend well beyond its operational bandwidth. A rule of thumb is to specify the PA bandwidth (and its flatness) to extend to linearizer bandwidth. As an example, considering a instantaneous signal BW of 20 MHz (4 contiguous WCDMA channels) in the UMTS band, if the carrier signals are located at 2110-2130 MHz and assuming the linearizer corrects up to the 5th order of none-linearity, the PA bandwidth should extend beyond 2070 MHz in the lower side of the UMTS band. For an instantaneous BW of 75 MHz, and assuming a linearization BW of 250 MHz, the PA gain flatness should extend to around 250 MHz at least.

The implication of the above theory on the wideband Doherty design is that, although the main and peaking amplifier driver stages are smaller in size, nonetheless in wideband applications they will end up with a poor input match over wide bandwidth. In a tightly coupled network having a 3 dB or 5 dB coupler, a poor match in the driver stage means that the reflected power from these stages causes some degree of coupling between the main and peaking arm of a Doherty power amplifier. It is well known to those skilled in the art that it is critical to have a correct phase and amplitude balance in a Doherty amplifier to achieve the optimum peak power, efficiency and smooth AM to AM and AM to PM characteristics. However, the above mentioned parasitic coupling between the two arms makes the amplifier alignment a formidable task.

Figure 5:
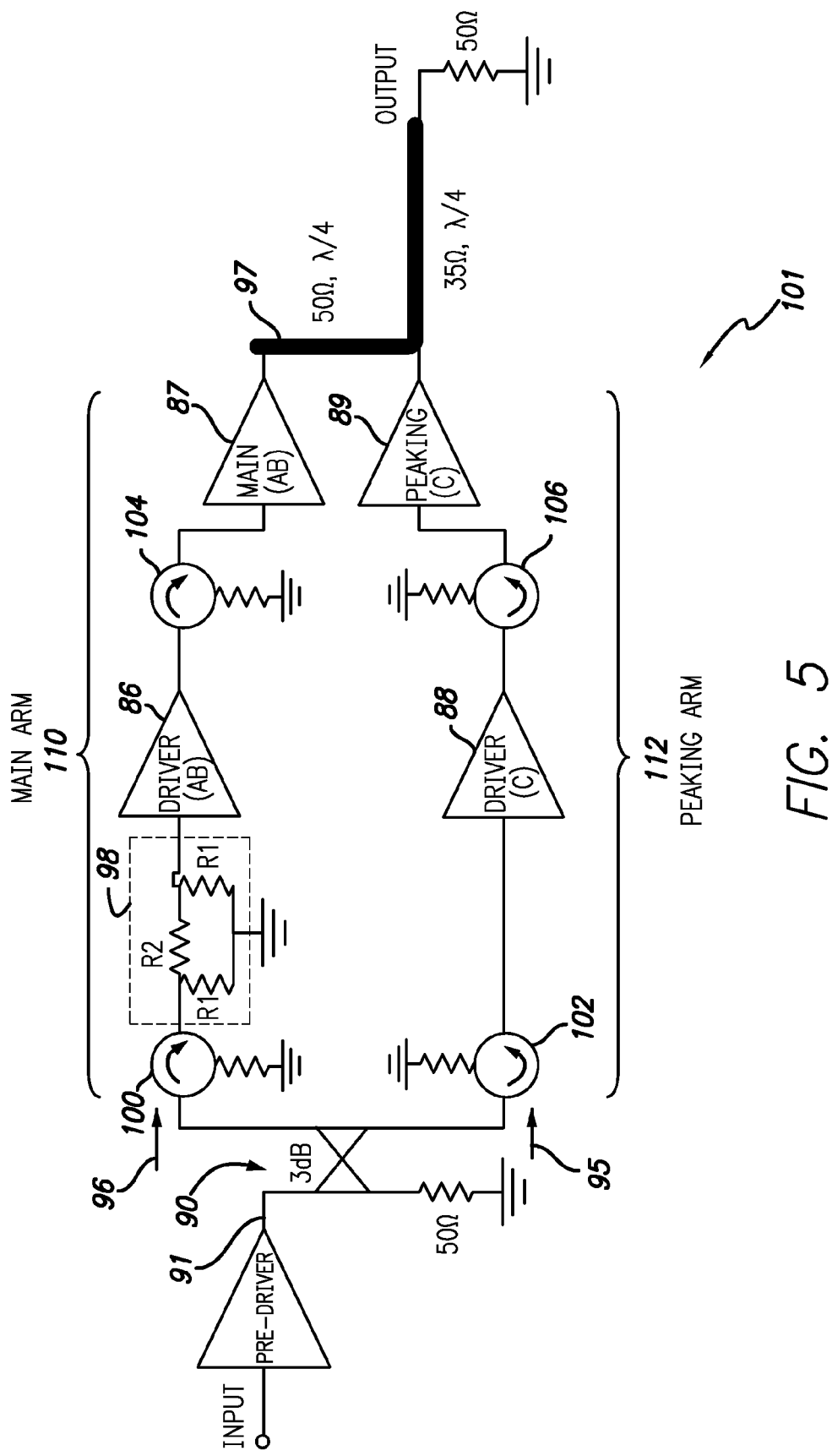
FIG. 5 is a schematic block diagram of an embodiment for achieving wideband performance.

FIG. 5 is a schematic block diagram of one or more embodiments which may address the above mentioned problems. FIG. 5 illustrates an exemplary embodiment of a power amplifier 101 having an input 91, a divider circuit 90 coupled to the input 91, a main arm 110, a peaking arm 112, and a combiner circuit 97. The divider circuit 90 splits the signal from input 91 and provides a first input signal 96 to the main arm 110 and a second input signal 95 to the peaking arm 112. The main arm 110 may comprise a first main path isolator 100 which receives the first input signal 96. The output of the first main path isolator 100 may be coupled to a passive attenuator 98 which may have an output coupled to the input of a main driver 86. The output of the main driver 86 may be coupled to second main path isolator 104, which has an output coupled to the input of main amplifier 87, which provides an amplified main signal at the output of the main amplifier 87. The peaking arm 112 may comprise a first peaking arm isolator 102 having an output which may be coupled to the input of peaking driver 88. The output of the main driver 88 may be coupled to second peaking arm isolator 106, which may have an output coupled to the input of main amplifier 89, which provides an amplified main signal at the output of the peaking amplifier 89. A combiner circuit 97 receives the amplified main signal and the amplified peaking signal and provides an output signal to the load.

The addition of pair isolators 100 and 102 at the input of the driver stages removes the reflected power due to input mismatch of the driver stages. The application of isolators helps decouple the main arm 110 and peaking arm 112 easing the overall PA alignment. Ferrite isolators are the preferred devices to alleviate the poor match at the input of the driver amplifiers but other alternative means are not excluded. The use of additional isolators 104 and 106 also help the interstage match and overall PA adjustments.

The foregoing descriptions of preferred embodiments of the invention are purely illustrative and are not meant to be limiting in nature. Those skilled in the art will appreciate that a variety of modifications are possible while remaining within the scope of the present invention.

The present invention has been described primarily as a system and method for a wide-bandwidth multi-stage Doherty power amplifier. In this regard, the system and methods for the modified Doherty amplifier are presented for purposes of illustration and description. Furthermore, the description is not intended to limit the invention to the form disclosed herein. Accordingly, variants and modifications consistent with the following teachings, skill, and knowledge of the relevant art, are within the scope of the present invention. The embodiments described herein are further intended to explain modes known for practicing the invention disclosed herewith and to enable others skilled in the art to utilize the invention in equivalent, or alternative embodiments and with various modifications considered necessary by the particular application(s) or use(s) of the present invention.

What is claimed is:

1. A power amplifier adapted for amplifying an RF signal, comprising:
   an input for receiving an RF input signal;
   a divider circuit coupled to the input and receiving the input signal and splitting the input signal into a first input signal and a second input signal;
   a main signal path coupled to the divider circuit and receiving the first input signal and providing an amplified main signal, the main signal path comprising a main path driver amplifier and a main amplifier, wherein the main signal path further comprises a passive attenuator receiving the first input signal and providing an attenuated first input signal to the input of the main path driver amplifier; and,
   a peaking signal path coupled to the divider circuit and receiving the second input signal and providing an amplified peaking signal, the peaking signal path comprising a peaking path driver amplifier and a peaking amplifier, wherein the peaking path driver amplifier has substantially the same power rating as the main path driver amplifier and is biased in a higher efficiency class than the main path driver amplifier.

2. The power amplifier adapted for amplifying an RE signal as set out in claim 1, wherein the main path driver amplifier output is coupled to the input of the main 20 amplifier.

3. The power amplifier adapted for amplifying an RF signal as set out in claim 1, wherein the main path driver amplifier is biased in class AB.

4. The power amplifier adapted for amplifying an RF signal as set out in claim 1, wherein the divider circuit comprises a 3 dB coupler.

5. The power amplifier adapted for amplifying an RF signal as set out in claim 1, further comprising a quarter wave combiner circuit receiving the amplified main signal and the amplified peaking signal and providing an output signal.

6. The power amplifier adapted for amplifying an RF signal as set out in claim 1, wherein the peaking amplifier is biased in class C.

7. A methhod for amplifying an RF input signal, comprising:
   receiving an RF input signal;
   splitting the input signal into first and second substantially equal power input signals between a main signal path and a peaking signal path, the main signal path receiving the first input signal and the peaking signal path receiving the second input signal; attenuating the first input signal to provide an attenuated first input signal; amplifying the attenuated first input signal in the main signal path with a main path driver amplifier to provide a first-stage amplified main signal;
   amplifying the first stage amplified main signal in the main signal path with a main amplifier to provide an amplified main signal;
   amplifying the second input signal in the peaking signal path with a peaking path driver amplifier biased in class C to provide a first-stage amplified peaking signal;
   amplifying the first-stage amplified peaking signal with a peaking amplifier to provide an amplified peaking signal; and, combining the amplified main signal and the amplified peaking signal and providing an output signal.

8. The method for amplifying an RF input signal as set out in claim 7, wherein the main path driver amplifier has a power rating approximately equal to a power rating of the peaking path driver amplifier.

9. A method for amplifying, an RF input signal, comprising:
   receiving an RF input signal;
   splitting the input signal into first and second substantially equal power input signals between a main signal path and a peaking signal path, the main signal path receiving the first input signal and the peaking signal path receiving the second input signal;
   removing reflected power in the main signal path with a first main isolator to provide an isolated first input signal;
   amplifying the isolated first input signal in the main signal path with a main path driver amplifier to provide a first-stage amplified main signal;
   amplifying the first-stage amplified main signal in the main signal path with a main amplifier to provide an amplified main signal;
   removing reflected power in the peaking signal path with a first peaking isolator to provide an isolated second input signal;
   amplifying the isolated second input signal in the peaking signal path with a peaking path driver amplifier biased in class C to provide a first-stage amplified peaking signal;
   amplifying the first-stage amplified peaking signal with a peaking amplifier to provide an amplified peaking signal; and,
   combining the amplified main signal and the amplified, peaking signal and providing an output signal.

10. The method for amplifying an RF input signal as set out in claim 9, wherein amplifying the isolated first input signal comprises:
   attenuating the isolated first input signal with a passive attenuator to provide an attenuated first input signal; and,
   amplifying the attenuated first input signal to provide, the first-stage amplified main signal.

11. The method for amplifying an RF input signal as set out in claim 9, wherein:
   amplifying the first-stage amplified main signal further comprises:
   removing reflected power in the main signal path with a second main isolator to provide an isolated first-stage amplified main signal; and,
   amplifying the isolated first-stage amplified main signal to provide the amplified main signal; and wherein
   amplifying the first-stage amplified peaking signal futher comprises:
   removing reflected power in the peaking signal path with a second peaking isolator to provide an isolated first-stage amplified peaking signal; and,
   amplifying the isolated second-stage amplified peaking signal to provide the amplified peaking signal.

12. The method for amplifying an RF input signal as set out in claim 9, wherein the main path driver amplifier has a power rating approximately equal to a. power rating of the peaking path driver amplifier.

\* \* \* \* \*

UNITED STATES PATENT AND TRADEMARK OFFICE
CERTIFICATE OF CORRECTION

PATENT NO. : 9,083,284 B2  
APPLICATION NO. : 13/413468  
DATED : July 14, 2015  
INVENTOR(S) : Maslennikov et al.

Page 1 of 1

It is certified that error appears in the above-identified patent and that said Letters Patent is hereby corrected as shown below:

Claims

In column 8, line 14, in Claim 7, delete "methhod" and insert --method--, therefor In column 8, line 26, in Claim 7, delete "first stage" and insert --first-stage--, therefor In column 8, line 34, in Claim 7, after "and,", insert --¶--, therefor In column 8, line 40, in Claim 9, delete "amplifying," and insert --amplifying--, therefor In column 8, line 66, in Claim 9, delete "amplified," and insert --amplified--, therefor In column 9, line 7, in Claim 10, delete "provide," and insert --provide--, therefor In column 9, line 18, in Claim 11, delete "futher" and insert --further--, therefor In column 9, line 27, in Claim 12, delete "a." and insert --a--, therefor Signed and Sealed this  
Twelfth Day of January, 2016

Michelle K. Lee  
*Director of the United States Patent and Trademark Office*